United States Patent [19]

Nakagawa et al.

[11] 4,456,885
[45] Jun. 26, 1984

[54] FILTER CIRCUIT SUITABLE FOR BEING FABRICATED INTO INTEGRATED CIRCUIT

[75] Inventors: Isao Nakagawa, Katsuta; Kazuo Kondo, Yokohama; Mitsuru Kudo, Katsuta, all of Japan

[73] Assignee: Hitachi, Ltd., Tokyo, Japan

[21] Appl. No.: 308,589

[22] Filed: Oct. 5, 1981

[30] Foreign Application Priority Data

Oct. 7, 1980 [JP] Japan .................... 55-139400

[51] Int. Cl.³ .................... H03F 1/34; H03G 3/10
[52] U.S. Cl. .................... 330/107; 330/109; 330/281
[58] Field of Search ........... 330/86, 107, 109, 278, 330/303, 281, 307

[56] References Cited

FOREIGN PATENT DOCUMENTS 26145 2/1977 Japan .................... 330/86

Primary Examiner—James B. Mullins
Assistant Examiner—G. Wan
Attorney, Agent, or Firm—Antonelli, Terry & Wands

[57] ABSTRACT

A time-constant circuit suitable for being fabricated into an integrated circuit comprising a resistive element with its one end connected to a first input terminal, an impedance converting circuit with its input connected to another end of said resistive element and its output connected to an output terminal, a variable gain differential amplifier with its one input connected to the output of said impedance converting circuit and its another input connected to a second input terminal, an adder circuit for adding an output from said amplifier and an input signal appearing on said second input terminal, and a capacitive element connected between the junction of said resistive element and said impedance converting circuit and the output of said adder circuit. A plurality of the time-constant circuits are combined to construct a filter circuit. The gain of the variable gain differential amplifier in each time-constant circuit is controlled by a common DC voltage, whereby the spread of characteristic values of the integrated circuit elements can be compensated.

7 Claims, 8 Drawing Figures

FILTER CIRCUIT SUITABLE FOR BEING FABRICATED INTO INTEGRATED CIRCUIT

The present invention relates to a time-constant circuit, and more particularly to a time-constant circuit which can form a filter circuit suitable for being fabricated into an integrated circuit.

In general, inductive elements (L) cannot be integrated within an integrated circuit (IC). Therefore, the time-constant circuit for filters within the integrated circuit must be fabricated using capacitors (C) and resistors (R). A filter comprising an active element and an RC time-constant circuit is known, and is generally called an active filter. The active filter can be fabricated into an integrated circuit in principle. However, due to the following practical problems, it is difficult to integrate filters within the integrated circuit.

FIG. 1 is a schematic diagram illustrating an example of the 2nd order low pass filter (hereinafter referred to as LPF) formed in an active filter, where an impedance converter 3 has a sufficiently high input impedance and a sufficiently low output impedance with the voltage gain of unity. The transfer function $H(\omega)$ of the 2nd order LPF can be expressed as follows.

$$H(\omega) = \frac{\frac{1}{R_1 R_2 C_1 C_2}}{(j\omega)^2 + (j\omega)\left(\frac{1}{R_1 C_1} + \frac{1}{R_2 C_1}\right) + \frac{1}{R_1 R_2 C_1 C_2}} \quad (1)$$

For the circuit of FIG. 1, the resonance frequency $\omega o$ and the value Q which represents the quality of the circuit are expressed as follows.

$$\omega o = \frac{1}{\sqrt{R_1 C_1 \cdot R_2 C_2}} \quad (2)$$

$$Q = \frac{1}{\sqrt{\frac{R_2 C_2}{R_1 C_1}} + \sqrt{\frac{R_1 C_2}{R_2 C_1}}} \quad (3)$$

Generally, circuit elements of the same type within an integrated circuit are fabricated simultaneously, resulting in a strong correlation in the characteristic values among each circuit element. Thus, the resistance value ratio and the capacitance value ratio can be made substantially constant. However, the accuracy of each absolute value is not so good. For example, whereas the absolute value accuracy of the resistance is about ±15% and that of the capacitance is about ±12%, the accuracy of the resistance value ratio and the capacitance value ratio can be made approximately ±1% and ±0.1%, respectively.

Accordingly, the spread of the value of Q which is determined by the resistance value ratio and the capacitance value ratio can be made small without difficulty, whereas the accuracy of the resonance frequency, which is determined by the absolute value of the resistance and capacitance, ranges approximately ±20%. The resonance frequency $\omega o$ is a very important parameter for determining the cut-off frequency of the LPF, and it is not available for practical use if the resonance frequency spreads in a range as ±20%.

Therefore, all of the resistors and capacitors must have been provided outside of the integrated circuit to utilize the filter in this arrangement. A low-order filter such as in 2nd order may meet the requirement in this arrangement, however, filters in higher order are often demanded. In that case, a high order filter is made by combination of 2nd order filters, and the arrangement of the external resistors and capacitors not only causes an increase in the number of circuit components but necessitates many IC pins. Thus, it has been considered that the filter circuit is not suitable for being fabricated into an integrated circuit.

It is an object of the present invention to provide a filter circuit which is suitable for being fabricated into an integrated circuit including elements for determining the time-constant, and requires fewer number of pins and peripheral circuit components. According to the present invention, a time-constant circuit is formed of a resistor, a capacitor, a variable gain amplifier which is controlled by a DC signal, and an impedance converter. Such time-constant circuits are combined to form an integrated filter circuit having a small number of peripheral components and pins, wherein the gain of each variable gain amplifier within 2nd order or higher order filters is adjusted together by a DC potential, thereby compensating the spread of the RC time-constant of the circuits within the integrated circuit.

According to the characteristic of the present invention, the spread of the resistance and capacitance values of the filter circuit integrated within the same integrated circuit can be compensated with the same DC control voltage, thereby permitting the integration of all resistors and capacitors for the time-constant circuits within the integrated circuit merely by providing a single control terminal, whereby the number of components can be reduced effectively, and large scale integration is made possible due to a small number of terminals needed. Thus the invention significantly contributes to the manufacture of compact filter circuits.

Other objects, features and advantages of the present invention will become apparent from the following detailed description of preferred embodiments thereof taken in conjunction with the accompanying drawings, in which.

Figure 1:
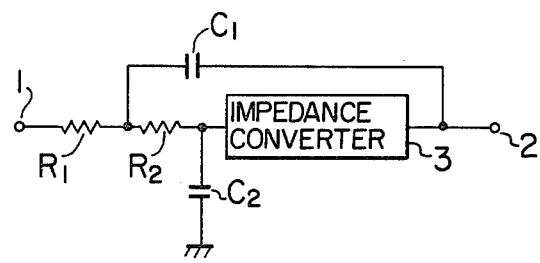
FIG. 1 shows an example of the conventional active filter circuit.
Figure 2:
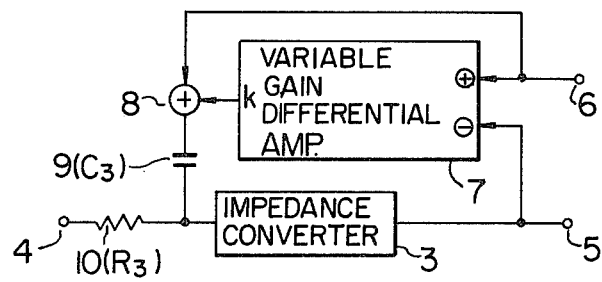
FIG. 2 is a block diagram exemplifying the time-constant circuit which is the primary block of the filter circuit according to the present invention.

The invention will now be described by way of embodiment with reference to the drawings. FIG. 2 is a block diagram showing an example of the time-constant circuit which is the primary block of the present invention. The circuit includes a first input terminal 4 for the time-constant circuit, an output terminal 5, a second input terminal 6, an impedance converter 3 having a voltage gain of unity, a variable gain differential amplifier 7, the gain of which varies in the range from 0 to 1, an adder circuit 8, a capacitor 9, and a resistor 10.

The capacitor 9 has the value of $C_3$ and the resistor 10 has the value of $R_3$. Assuming that the gain of the variable gain differential amplifier 7 is k, the transfer function $H_1(\omega)$ seen from the input terminal 4 to the output terminal 5 with the input terminal 6 being grounded can be expressed as:

$$H_1(\omega) = \frac{1}{1 + j\omega C_3(1 + k)R_3} \tag{4}$$

The transfer function $H_2(\omega)$ seen from the input terminal 6 to the output terminal 5 with the input terminal 4 being grounded can be expressed as:

$$H_2(\omega) = \frac{j\omega C_3(1 + k)R_3}{1 + j\omega C_3(1 + k)R_3} \tag{5}$$

Figure 3:
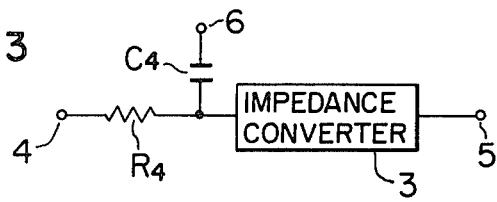
FIG. 3 shows an equivalent circuit diagram of the circuit shown in FIG. 2.

Thus, the circuit of FIG. 2 is equivalent to the time-constant circuit shown in FIG. 3, provided:

$$R_4 = R_3 \tag{6}$$

and $$C_4 = (1+k)C_3 \tag{7}$$

Since the gain k can be varied in the range from 0 to 1, the value of $C_4$ can vary in the range from $C_3$ to $2C_3$. That is, the value of $C_4$ can vary in the range from $-33\%$ to $+33\%$ relative to the value at $k=\frac{1}{2}$. As described earlier, the spread of the time constant created by a capacitor and a resistor fabricated within the integrated circuit is in the range of $\pm 20\%$, thus it can be compensated by this circuit arrangement.

Figure 4:
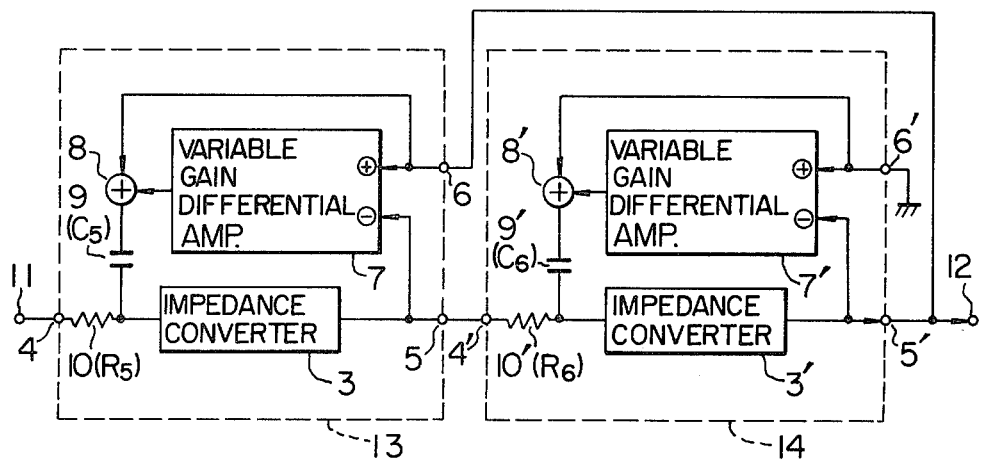
FIG. 4 is a block diagram showing one embodiment of the filter circuit according to the present invention.

FIG. 4 shows an embodiment of the present invention where two of the time-constant circuit shown in FIG. 2 are combined to constitute a 2nd order LPF, which includes an input terminal 11 for the 2nd order LPF, an output terminal 12 for the 2nd order LPF, a first time-constant circuit 13, and a second time-constant circuit 14. Variable gain differential amplifiers 7 and 7' in the time-constant circuits 13 and 14, respectively, have an identical gain of k. By use of the equivalent circuit shown in FIG. 3, the two time-constant circuits in FIG. 4 can be transformed into a circuit as shown in FIG. 5.

Figure 5:
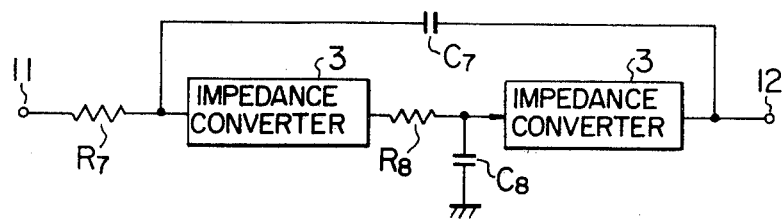
FIG. 5 shows an equivalent circuit diagram of the circuit shown in FIG. 4.

Herein, the values of $R_7$, $C_7$, $R_8$, $C_8$ in FIG. 5 are in the following relation to the value $R_5$ of the resistor 10 and the value $C_5$ of the capacitor 9 in the first time-constant circuit 13 and the value $R_6$ of the resistor 10' and the value $C_6$ of the capacitor 9' in the second time-constant circuit 14:

$$R_7 = R_5 \tag{8}$$

$$C_7 = (1+k)C_5 \tag{9}$$

$$R_8 = R_6 \tag{10}$$

$$C_8 = (1+k)C_6 \tag{11}$$

The transfer function $H_3(\omega)$ of the 2nd order LPF shown in FIG. 5 can be expressed in the following equation.

$$H_3(\omega) = \frac{\frac{1}{C_7R_7C_8R_8}}{(j\omega)^2 + (j\omega)\frac{1}{C_8R_8} + \frac{1}{C_7R_7C_8R_8}} \tag{12}$$

Accordingly, the value of Q and the resonance frequency $\omega o$ of the circuit of FIG. 5 are obtained as follows.

$$Q = \sqrt{\frac{C_7R_7}{C_8R_8}} \tag{13}$$

$$\omega o = \frac{1}{\sqrt{C_7R_7C_8R_8}} \tag{14}$$

This is, the value of Q and the resonance frequency $\omega o$ of the circuit of FIG. 4 can be expressed as follows.

$$Q = \sqrt{\frac{(1 + k)C_5R_5}{(1 + k)C_6R_6}} = \sqrt{\frac{C_5R_5}{C_6R_6}} \tag{15}$$

$$\omega o = \frac{1}{\sqrt{(1 + k)C_5R_5 \times (1 + k)C_6R_6}} = \frac{1}{(1 + k)\sqrt{C_5R_5C_6R_6}} \tag{16}$$

As can be seen from equations (15) and (16), the value of Q is not varied by changing the gain k, and thus the resonance frequency $\omega o$ of the circuit of FIG. 4 can be varied without affecting the value of Q. Consequently, the spread of the resonance frequency due to the spread of the absolute values of capacitors and resistors can be compensated by varying the gain k of the variable gain differential amplifiers 7 and 7'. Moreover, the two variable gain differential amplifiers 7 and 7' have exactly the same gain, allowing the control with a common DC voltage.

LPFs of much higher order can be realized by combination of the above 2nd order LPFs. As can be seen from the nature of the IC fabricating process, when high order LPFs are fabricated within an integrated circuit, the absolute values of resistors and capacitors of 2nd order LPFs have the same trend of spreading. That is, they spread identically from the desired time constant and this allows all the variable gain differential amplifiers to have the same gain, which can be controlled with a single DC voltage. In addition, a plurality of filters fabricated within an integrated circuit have the same time constant spread from the desired time constant, thereby allowing their adjustment for the desired time constant with a single DC voltage.

Figure 6:
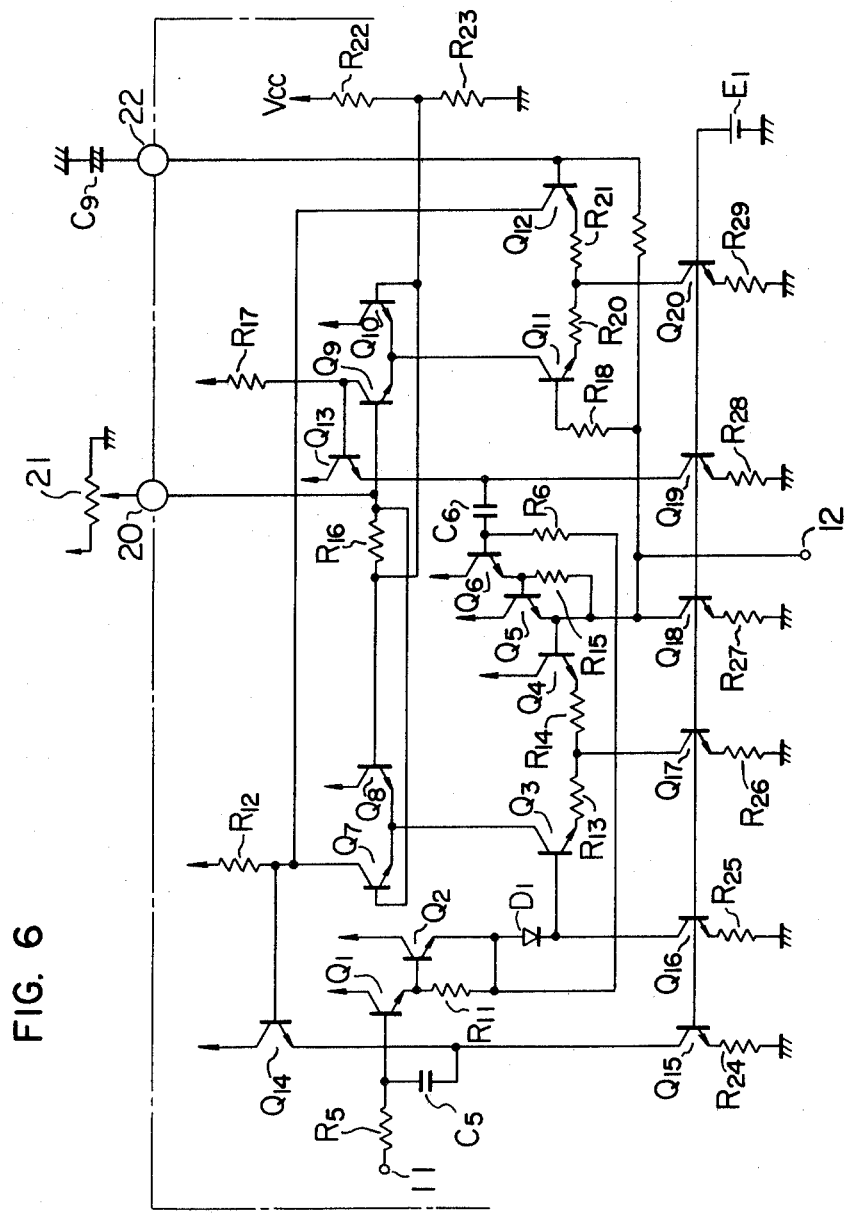
FIG. 6 is a schematic diagram showing an example of a specific circuit in accordance with the circuit shown in FIG. 4.

FIG. 6 shows an example of the practical circuit for the embodiment shown in FIG. 4. In FIG. 6, resistor $R_5$ and capacitor $C_5$ correspond to the resistor 10 and the capacitor 9 of the first time-constant circuit 13 shown in FIG. 4, and resistor $R_6$ and capacitor $C_6$ correspond to the resistor 10' and the capacitor 9' of the second time-constant circuit 14 shown in FIG. 4. Darlington-coupled transistors $Q_1$ and $Q_2$ constitute the impedance converter 3 in the first time-constant circuit 13 shown in FIG. 4, and differential transistor pairs $Q_3$ and $Q_4$, and $Q_7$ and $Q_8$ constitute the variable gain differential amplifier 7 in the first time-constant circuit 13. Transistors $Q_5$ and $Q_6$ constitute the impedance converter 3' in the second time-constant circuit 14, and differential transistor pairs $Q_9$ and $Q_{10}$, and $Q_{11}$ and $Q_{12}$ constitute the variable gain differential amplifier 7' in the second time-constant circuit 14. Reference numbers 20 and 22 denote pins on the integrated circuit, 21 is an external variable resistor for controlling the gain of the variable gain amplifier, $C_9$ is an external signal smoothing capacitor, and $Q_{15}$ to $Q_{20}$ are transistors for the constant current sources.

As can be seen from FIG. 6, the variable gain differential amplifiers 7 and 7' are achieved by the differential pairs $Q_7$ and $Q_8$, and $Q_9$ and $Q_{10}$ in a current switching mode. To make the circuit simple, the transistors $Q_{11}$ and $Q_{12}$ constituting the variable gain differential amplifier 7' in the second time-constant circuit 14 are adapted to serve also for a part of an adder circuit 8 in the first time-constant circuit 13 so that the collector current of the transistor $Q_{12}$ is added to the collector current of the transistor $Q_7$.

As shown in FIG. 4, the second input terminal 6' which is one input of the adder circuit 8' in the second time-constant circuit 14 is grounded, thus the adder circuit 8' simply buffers the output of the variable gain differential amplifier 7'. Also to make the circuit simple, the adder circuit 8' is omitted from the circuit of FIG. 6, and the collector current of the transistor $Q_9$ is converted into a voltage through a resistor $R_{17}$ and outputted through a low impedance buffer transistor $Q_{13}$. Although some circuit components are shared or omitted for simplifying the circuit, it does not means the alteration of the concept, but it is easily possible to consider the circuit in the original arrangement. In order to make the adder circuit 8 have a gain of unity for each input and to vary the gain of the variable gain differential amplifiers 7 and 7' in the range from 0 to 1, resistors $R_{12}$, $R_{13}$, $R_{14}$, $R_{17}$, $R_{20}$, $R_{21}$, $R_{26}$, and $R_{29}$ should be set, for example, to meet the following conditions.

$$R_{12}=R_{17}=R_{13}+R_{14}+2Re \quad (17)$$

$$R_{13}=R_{14}=R_{20}=R_{21} \quad (18)$$

$$R_{26}=R_{29} \quad (19)$$

where Re is the emitter operating resistance of the transistors $Q_3$, $Q_4$, $Q_{11}$ and $Q_{12}$.

Figure 7:
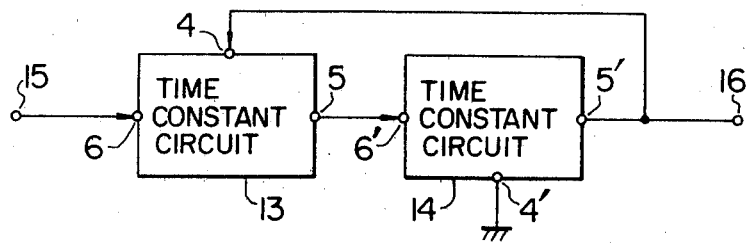
FIG. 7 is a block diagram showing another embodiment of the present invention.

FIG. 7 shows an embodiment of the present invention for constructing a 2nd order high-pass filter (HPF) circuit. The transfer function $H_4(\omega)$, the value of Q and the resonance frequency $\omega o$ of the HPF circuit of FIG. 7 are expressed as follows.

$$H_4(\omega) = \frac{(j\omega)^2}{(j\omega)^2 + (j\omega)\frac{1}{(1+k)C_6R_6} + \frac{1}{(1+k)^2 C_5R_5C_6R_6}} \quad (20)$$

$$Q = \sqrt{\frac{C_6R_6}{C_5R_5}} \quad (21)$$

$$\omega o = \frac{1}{(1+k)\sqrt{C_5R_5C_6R_6}} \quad (22)$$

In FIG. 7, reference number 15 denotes an input terminal and 16 is an output terminal.

Figure 8:
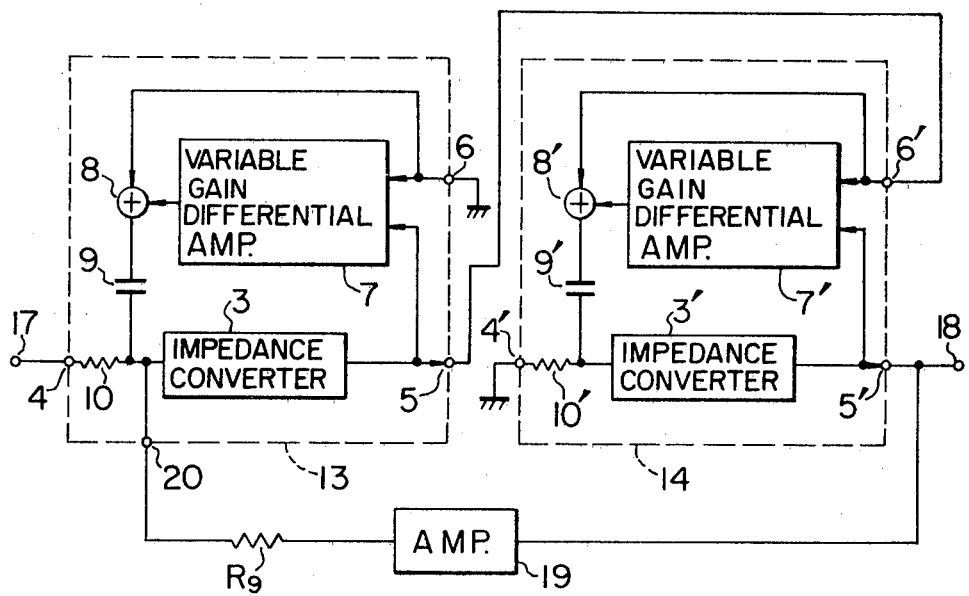
FIG. 8 is a block diagram showing still another embodiment of the present invention.

FIG. 8 shows an embodiment of the present invention for constructing a 2nd order band-pass filter (BPF). The transfer function $H_5(\omega)$, the value of Q and the resonance frequency $\omega o$ of the BPF circuit of FIG. 8 are expressed as follows.

$$H_5(\omega) = \frac{(j\omega)\frac{1}{(1+k)C_5R_5}}{(j\omega)^2 + (j\omega)\frac{1}{(1+k)C_6R_6} + \frac{1}{(1+k)^2 C_5R_5C_6R_6}} \quad (23)$$

$$Q = \sqrt{\frac{C_6R_6}{C_5R_5}} \quad (24)$$

$$\omega o = \frac{1}{(1+k)\sqrt{C_5R_5C_6R_6}} \quad (25)$$

In this case, the value of the resistor 10 in the first time-constant circuit 13 should be made as $2R_5$, twice the magnitude in the cases of the LPF and HPF, and the resistance $R_9$ should be set to meet $R_9=2R_5$. In FIG. 8, reference number 17 denotes an input terminal, 18 is an output terminal, 19 is an amplifier, and 20 is an input terminal.

Although the 2nd order BPF needs an additional amplifier having a gain of two and a resistor, it can be constructed basically by combination of two time-constant circuits.

It is well known in the art that any higher order filter can be composed by combination of a 2nd order LPF, 2nd order HPF, 2nd order BPF, 1st order LPF and a 1st order HPF.

Accordingly, the present invention easily provides a filter having desired characteristics by combining a 2nd order LPF, HPF and BPF, and a 1st order LPF and BPF as described in the foregoing embodiments.

What is claimed is:

1. A time-constant circuit capable of being fabricated into an integrated circuit including elements for determining a time constant comprising:
   a resistive element with its one end connected to a first input terminal;
   an impedance converting circuit with its input connected to another end of said resistive element;
   a variable gain differential amplifier with its one input connected to the output of said impedance converting circuit and another input connected to a second input terminal, and with its gain being variable by an external operation;
   an adder circuit for adding a signal entered through said second input terminal and an output signal from said variable gain differential amplifier; and
   a capacitive element connected between the input of said impedance converting circuit and the output of said adder circuit.

2. A filter circuit suitable for being fabricated into an integrated circuit comprising:
   a first time-constant circuit which comprises:
   a resistive element with its one end connected to a first input terminal,
   an impedance converting circuit with its input connected to another end of said resistive element and its output connected to an output terminal,
   a variable gain differential amplifier with its one input connected to the output of said impedance converting circuit and its another input connected to a second input terminal, and with its gain being variable by an external operation, an adder circuit for adding a signal entered through said second input terminal and an output signal from said variable gain differential amplifier, and a capacitive element connected between the input of said impedance converting circuit and the output of said adder circuit;

a second time-constant circuit having an identical structure to said first time-constant circuit and having a first and second input terminals and an output terminal;

means for supplying an output from said output terminal of said first time-constant circuit to said first input terminal of said second time-constant circuit;

means for supplying an output from said output terminal of said second time-constant circuit to said second input terminal of said first time-constant circuit; and means for grounding said second input terminal of said second time-constant circuit.

3. A filter circuit suitable for being fabricated into an integrated circuit comprising:

a first time-constant circuit which comprises:

a resistive element with its one end connected to a first input terminal, an impedance converting circuit with its input connected to another end of said resistive element and its output connected to an output terminal, a variable gain differential amplifier with its one input connected to the output of said impedance converting circuit and its another input connected to a second input terminal, and with its gain being variable by an external operation, an adder circuit for adding a signal entered from said second input terminal and an output signal from said variable gain differential amplifier, and a capacitive element connected between the input of said impedance converting circuit and the output of said adder circuit;

a second time-constant circuit having an identical structure to said first time-constant circuit and having a first and second input terminals and an output terminal;

means for supplying an output from said output terminal of said first time-constant circuit to said second input terminal of said second time-constant circuit;

means for supplying an output from said output terminal of said second time-constant circuit to said first input terminal of said first time-constant circuit; and means for grounding said first input terminal of said second time-constant circuit.

4. A filter circuit suitable for being fabricated into an integrated circuit comprising:

a first time-constant circuit which comprises:

a resistive element with its one end connected to a first input terminal, an impedance converting circuit with its input connected to another end of said resistive element and its output connected to an output terminal, a variable gain differential amplifier with its one input connected to the output of said impedance converting circuit and its another input connected to a second input terminal and with its gain being variable by an external operation, an adder circuit for adding a signal entered from said second input terminal and an output signal from said variable gain differential amplifier, and a capacitive element connected between the input of said impedance converting circuit and the output of said adder circuit;

a second time-constant circuit having an identical structure to said first time-constant circuit and having a first and second input terminals and an output terminal;

means for supplying an output from said output terminal of said first time-constant circuit to said second input terminal of said second time-constant circuit;

means for supplying an output from said output terminal of said second time-constant circuit through an amplifying circuit and serial-connected resistive elements to the input of said impedance converting circuit in said first time-constant circuit; and means for grounding said second input terminal of said first time-constant circuit and said first input terminal of said second time-constant circuit.

5. A filter circuit as claimed in any of claim 2 through claim 4 further comprising a current switching means formed of a differential transistor pairs for controlling the gain of said variable gain differential amplifier.

6. A filter circuit as claimed in claim 2 or claim 4, wherein said first time-constant circuit with its second input terminal grounded is constructed such that said capacitive element is connected directly between the output of said variable gain differential amplifier and the input of said impedance converting circuit in omission of said adder circuit.

7. A filter circuit as claimed in claim 2 or 4 wherein said second time-constant circuit with its second input terminal grounded is constructed such that said capacitive element is connected directly between the output of said variable gain differential amplifier and the input of said impedance converting circuit in omission of said adder circuit.

* * * * *